United States Patent
Joo

[19]

[11] Patent Number: 5,974,583
[45] Date of Patent: Oct. 26, 1999

[54] ERROR CORRECTING METHOD AND DEVICE

[75] Inventor: Tae-shik Joo, Kunpo, Rep. of Korea

[73] Assignee: Samsung Electronics Co., Ltd., Rep. of Korea

[21] Appl. No.: 08/953,352

[22] Filed: Oct. 17, 1997

[30] Foreign Application Priority Data

Oct. 18, 1996 [KR] Rep. of Korea ............... 96-46840

[51] Int. Cl.⁶ .............................................. H03M 13/00
[52] U.S. Cl. .................................................. 714/784
[58] Field of Search ................................... 714/784

[56] References Cited

U.S. PATENT DOCUMENTS

4,142,174  2/1979  Chen et al. ................ 340/146.1 L

*Primary Examiner*—Stephen M. Baker
*Attorney, Agent, or Firm*—Skjerven, Morrill, MacPherson, Franklin & Friel LLP; David T. Millers

[57] ABSTRACT

In an error correcting method for correcting three or fewer errors or six or fewer erasures, syndromes $S_0$ to $S_5$ from a received codeword are calculated. If the calculated syndromes $S_0$ to $S_5$ are all zeros, it is determined that there is no error. If syndromes $S_0$, $S_1$, and $S_2$ are zeros and at least one of the calculated syndromes $S_3$, $S_4$, and $S_5$ is not zero, it is determined that error correction is impossible. Subsequently, if exactly two of syndromes $S_0$, $S_1$, and $S_2$ are zeros, coefficients $\sigma 1$, $\sigma 2$, and $\sigma 3$ of an error-location polynomial are differently calculated depending on which of syndromes $S_0$, $S_1$, and $S_2$ is not zero. The calculated coefficients are used to determine error locations, an error type, the possibility of error correction, and if error correction is possible error values. If more or fewer than two of syndromes $S_0$, $S_1$, and $S_2$ are not zero, an error type and the possibility of error correction are determined using the syndromes $S_0$ to $S_4$ and the coefficients of the error location polynomial calculated depending on whether first and second syndrome equations obtained using syndromes $S_0$ to $S_3$ which are calculated according to the values of syndrome $S_0$ and $S_1$ are zeros, and error locations and values are calculated.

12 Claims, 5 Drawing Sheets

ERROR CORRECTING METHOD AND DEVICE

BACKGROUND OF THE INVENTION

1. Field of the Invention

The present invention relates to an error correcting method and device, and more particularly, to an error correcting method and device for rapidly and stably correcting a triple-error/six-erasure.

2. Description of the Related Arts

U.S. Pat. No. 4,142,174 issued Feb. 27, 1979 to Chen et. al. and entitled HIGH SPEED DECODING OF REED-SOLOMON CODES, describes how to obtain the coefficients of an error location polynomial equation when locating bit errors in codeword having a double-error, triple-error, or six-error. To find the coefficients, simultaneous equations can be solved using a classical method, such as, the Berlekamp-Messay method or a Newton identity. For example, a double-error has an error location polynomial $\sigma(x)$ given in Equation 1.

$$\sigma(x) = x^2 + \sigma_1 \cdot x + \theta_2 \quad \text{Equation 1}$$

The coefficients $\sigma_1$ and $\sigma_2$ of error location polynomial $\sigma(x)$ are determined from syndromes $S_0$ to $S_3$ obtained from an error correction code. In particular, simultaneous Equations 2, which contain coefficients $\sigma_1$ and $\sigma_2$ and syndromes $S_1$ to $S_3$, can be solved for coefficients $\sigma_1$, and $\sigma_2$ using a determinant of order 2 derived from a Newton identity.

$$\begin{bmatrix} S_2 \\ S_3 \end{bmatrix} = \begin{bmatrix} S_1 & S_0 \\ S_2 & S_1 \end{bmatrix} \cdot \begin{bmatrix} \sigma_1 \\ \sigma_2 \end{bmatrix} \quad \text{Equation 2}$$

Triple-error correction is more complex that double-error correction. An error location polynomial $\sigma(x)$ for triple-error correction is given as $$\sigma(x) = x^3 + \sigma_1 \cdot x^2 + x_2 \cdot x + \sigma_3 \quad \text{Equation 3}$$

or $$\sigma(x) = (x+\sigma^i) \cdot (x+\sigma^j) \cdot (x+\sigma^k) = x^3 + \sigma_1 x^2 + \sigma_2 x + \sigma_3 \quad \text{Equation 4}$$

The coefficients $\sigma_1$, $\sigma_2$ and $\sigma_3$ of the error location polynomial $\sigma(x)$ in Equation 3 are derivable from matrix Equation 5 and syndromes $S_0$ to $S_5$ from a received codeword.

$$\begin{bmatrix} S_3 \\ S_4 \\ S_5 \end{bmatrix} = \begin{bmatrix} S_2 & S_1 & S_0 \\ S_3 & S_2 & S_1 \\ S_4 & S_3 & S_2 \end{bmatrix} \cdot \begin{bmatrix} \sigma_1 \\ \sigma_2 \\ \sigma_3 \end{bmatrix} \quad \text{Equation 5}$$

Equation 5 has solutions shown in Equations 6.

$$\sigma_1 = \frac{S_2^2 S_3 + S_1^2 S_5 + S_0 S_3 S_4 + S_0 S_2 S_5 + S_1 S_2 S_4 + S_1 S_3^2}{S_2^3 + S_1^2 S_4 + S_0 S_3^2 + S_0 S_2 S_4} \quad \text{Equations 6}$$

$$\sigma_2 = \frac{S_2^2 S_4 + S_1 S_3 S_4 + S_0 S_3 S_5 + S_0 S_4^2 + S_2 S_3^2 + S_1 S_2 S_5}{S_2^3 + S_1^2 S_4 + S_0 S_3^2 + S_0 S_2 S_4}$$

$$\sigma_3 = \frac{S_2^2 S_5 + S_1 S_4^2 + S_3^3 + S_1 S_3 S_5}{S_2^3 + S_1^2 S_4 + S_0 S_3^2 + S_0 S_2 S_4}$$

A known technology can determine the number of errors. For example, the number of errors can be obtained using methods disclosed in Korea Patent Publications No. 94-4980, 95-34202, and 96-11689. However, known methods for solving an error number decision equation can require too much operation time. For example, Korea Patent Publication No. 96-11689 uses the values of the coefficients $\sigma_1$ and $\sigma_2$ obtained for the double-error correction to reduce the number of operations required when obtaining the values of the coefficients $\sigma_1$, $\sigma_2$, and $\sigma_3$ for triple-error correction and uses the values of the coefficients $\sigma_1$, $\sigma_2$, and $\sigma_3$ when obtaining the values of coefficients $\sigma_1$, $\sigma_2$, $\sigma_3$, and $\sigma_4$ for 4-error correction. However, this method still requires complicated operations to obtain the coefficients $\sigma_1$, and $\sigma_2$ of a location polynomial.

In a compact disk player (CDP) or a digital audio tape (DAT) which simply error-correction-encodes and decodes source digital audio data, high quality audio data can be provided to a user by carrying out the error correction of only a double-error correction/4- or 6-erasure correction and then interpolating uncorrected data. However, in a digital compact cassette (DCC), a mini disk (MD), or a video compact disk (VCD), which employs an audio/video data compression algorithm, compressed data is frequently frequency domain data rather than time domain data, and an uncorrected error significantly degrades the quality of decoded audio or video. Thus, the DCC, MD, and VCD need better error correction capabilities and typically perform a triple-error correction to decrease uncorrected errors.

Figure 1:
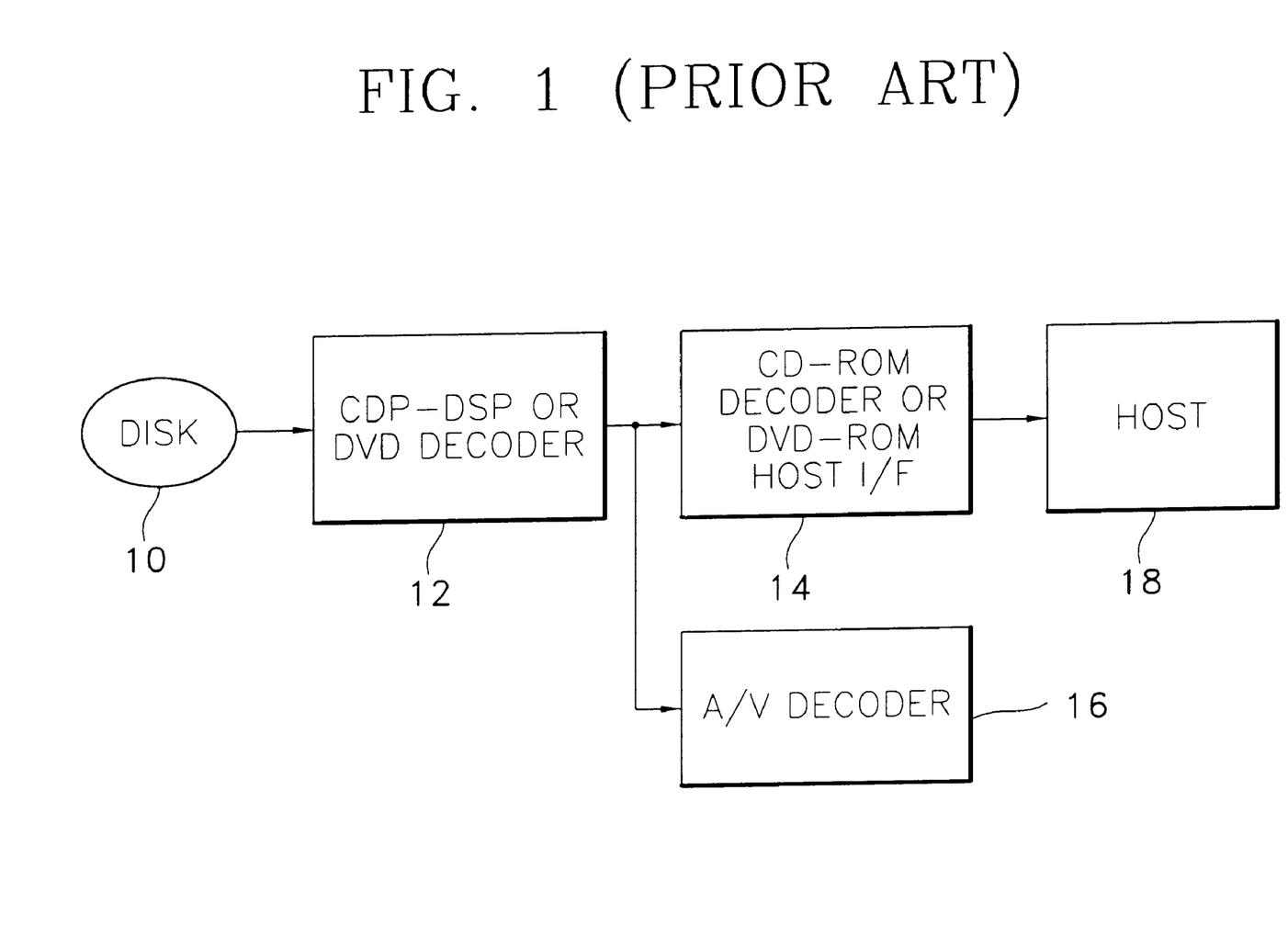
FIG. 1 is a block diagram of a conventional CD-ROM or DVD-ROM system.

On the other hand, an error correction decoding in a conventional CD-ROM or DVD-ROM system may reduce a transmission speed of a reproduced data to a host, which will be described with reference to FIG. 1. FIG. 1 is a simplified block diagram of the CD-ROM or DVD-ROM system. The system has a disk 10, a compact disk player-digital signal processor (CDP-DSP) or DVD decoder 12, a CD-ROM decoder or a DVD-ROM host interface (I/F) 14, and an audio/video (A/V) decoder 16. Also, CD-ROM decoder or a DVD-ROM host I/F 14 is interfaced with an external host 18. When CDP-DSP or DVD decoder 12 of FIG. 1 transmits data read from disk 10 to CD-ROM decoder or the DVD-ROM host I/F 14, or A/V decoder 16, data buffering or data transmission by CDP-DSP or DVD decoder 12 is performed at high speed. However, the data or error correction decoding in CD-ROM decoder or the DVD-ROM host I/F 14 requires time and may reduce the data transmission speed. Accordingly, fast error correction decoding methods and decoders are desired.

SUMMARY OF THE INVENTION

An object of the present invention is to provide an error correcting method for more rapidly and stably correcting errors by efficiently obtaining the coefficients of an error location polynomial from syndrome values.

Another object of the present invention is to provide an error correcting device for performing the above error correcting method.

To achieve one of the objects above, there is provided an error correcting method for correcting three or fewer errors or six or fewer erasures. The method first determines syndromes $S_0$ to $S_5$ from a received codeword and then determines whether the calculated syndromes $S_0$ to $S_5$ are all zeros. If the calculated syndromes $S_0$ to $S_5$ are all zeros, there is no error. If syndromes $S_0$ to $S_5$ are not all zeros, it is determined whether syndromes $S_0$, $S_1$, and $S_2$ are zeros and at least one of syndromes $S_3$, $S_4$, and $S_5$ is not zero. If syndromes $S_0$, $S_1$, and $S_2$ are zeros and at least one of the calculated syndromes $S_3$, $S_4$, and $S_5$ is not zero, error correction is impossible. Otherwise, coefficients σ1, σ2, and σ3 of an error-location polynomial are calculated using different methods depending on whether and which of the three syndromes $S_0$, $S_1$, and $S_2$ are zeros. If all of the calculated syndromes $S_0$, $S_1$, and $S_2$ are not zeros or the calculated syndromes $S_3$, $S_4$, and $S_5$ are all zeros, the method determines an error type and the possibility of error correction depending on whether error locations calculated from the calculated coefficients are in a codeword. An error type and the possibility of error correction are determined using the syndromes $S_0$ to $S_4$ and the coefficients of the error location polynomial calculated depending on whether first and second syndrome equations obtained using syndromes $S_0$ to $S_3$ which are calculated according to the values of syndromes $S_0$ and $S_1$ are zeros if two of the syndromes $S_0$ to $S_2$ are not zeros, and error locations and values are calculated.

To achieve another of the objects above, an error correcting device for correcting three or fewer errors or six or fewer erasures comprises means for storing a received codeword; means for receiving the received codeword stored in the received codeword storing means and generating syndromes $S_0$ to $S_5$; operating means for calculating coefficients σ1, σ2, and σ3 of an error-location polynomial as $$\sigma_1 = \frac{S_4}{S_3}$$

$$\sigma_2 = \frac{S_5 + \sigma_1 S_4}{S_3}$$

$$\sigma_3 = \frac{S_3}{S_0}$$

in response to a first control signal, calculating the coefficients σ1, σ2, and σ3 of the error-location polynomial as $$\sigma_1 = \frac{S_5 + \sigma_2 S_3}{S_4}$$

$$\sigma_2 = \frac{S_3}{S_1}$$

$$\sigma_3 = \frac{S_4}{S_1} + \sigma_2 \sigma_1$$

in response to a second control signal, calculating the coefficients σ1, σ2, and σ3 of the error-location polynomial as $$\sigma_1 = \frac{S_3}{S_2}$$

$$\sigma_2 = \frac{S_4 + \sigma_1 S_3}{S_2}$$

$$\sigma_3 = \frac{S_5 + \sigma_1 S_4 + \sigma_2 S_3}{S_2}$$

in response to a third control signal, calculating the first and second syndrome equations A and B as $$A = S_2 + \sigma \cdot S_1$$

$$B = S_3 + \sigma \cdot S_2 \text{(where σ is } S_1/S_0\text{)}$$

in response to a fourth control signal, calculating coefficients σ1' and σ2' of the error-location polynomial, and D as $$\sigma1' = (S_1 \cdot S_2 + S_0 \cdot S_3)/\Delta \text{(where} \Delta = S_1^2 + S_0 \cdot S_2 \neq 0\text{)}$$

$$\sigma2' = (S_1 \cdot S_3 + S_2^2)/\Delta$$

$$D = S_4 + \sigma1 \cdot S_3 + \sigma2 \cdot S_2$$

in response to a fifth control signal, calculating error locations and values from σ1' and σ2' in response to a sixth control signal, calculating coefficients Σ1, Σ2, and Σ3 of an error-location polynomial as $$\Sigma 1 = (S_3 \cdot \sigma2' + S_4 \cdot \sigma1' + S_5)/D$$

$$\Sigma 2 = (S_1 \cdot S_3 + S_0 \cdot S_4)/\Delta + \Sigma 1 \cdot \sigma1'$$

$$\Sigma 3 = (S_1 \cdot S_4 + S_2 \cdot S_3)/\Delta + \rho 1 \cdot \sigma 2'$$

in response to a seventh control signal, and calculating error locations and values from Σ1, Σ2, and ρ3; operation controlling means for generating the first control signal if both syndrome $S_1$ and syndrome $S_2$ are zeros and syndrome $S_0$ is not zero, the second control signal if both syndrome $S_0$ and syndrome $S_2$ are zeros and syndrome $S_1$ is not zero, the third control signal if both syndrome $S_0$ and syndrome $S_1$ are zeros and syndrome $S_2$ is not zero, the fourth control signal if two of the syndromes $S_0$, $S_1$, and $S_2$ are not zeros and if syndrome $S_0$ is not zero or syndrome $S_1$ is zero, the fifth control signal if both A and B are not zero, the sixth control signal if D is zero, and a seventh control signal if D is not zero; controlling means for determining that no error is generated if all syndromes $S_0$ to $S_5$ are zeros, that error correction is impossible if all of the syndromes $S_0$, $S_1$, and $S_2$ are zeros and all of the syndromes $S_3$, $S_4$, and $S_5$ are not zeros, that three errors are generated if the error locations obtained from σ1, σ2, and σ3 are in a codeword, that error correction is impossible if they are not in the codeword, that an error is generated if both A and B are zeros, that two errors are generated if D is zero, and that three errors are generated if D is not zero; and means for performing single-error correction, double-error correction, or triple-error correction according to the determination result of the determination controlling means.

BRIEF DESCRIPTION OF THE DRAWINGS

The above objects and advantages of the present invention will become more apparent by describing preferred embodiments thereof with reference to the attached drawings in which.

DETAILED DESCRIPTION OF THE INVENTION

Figure 2:
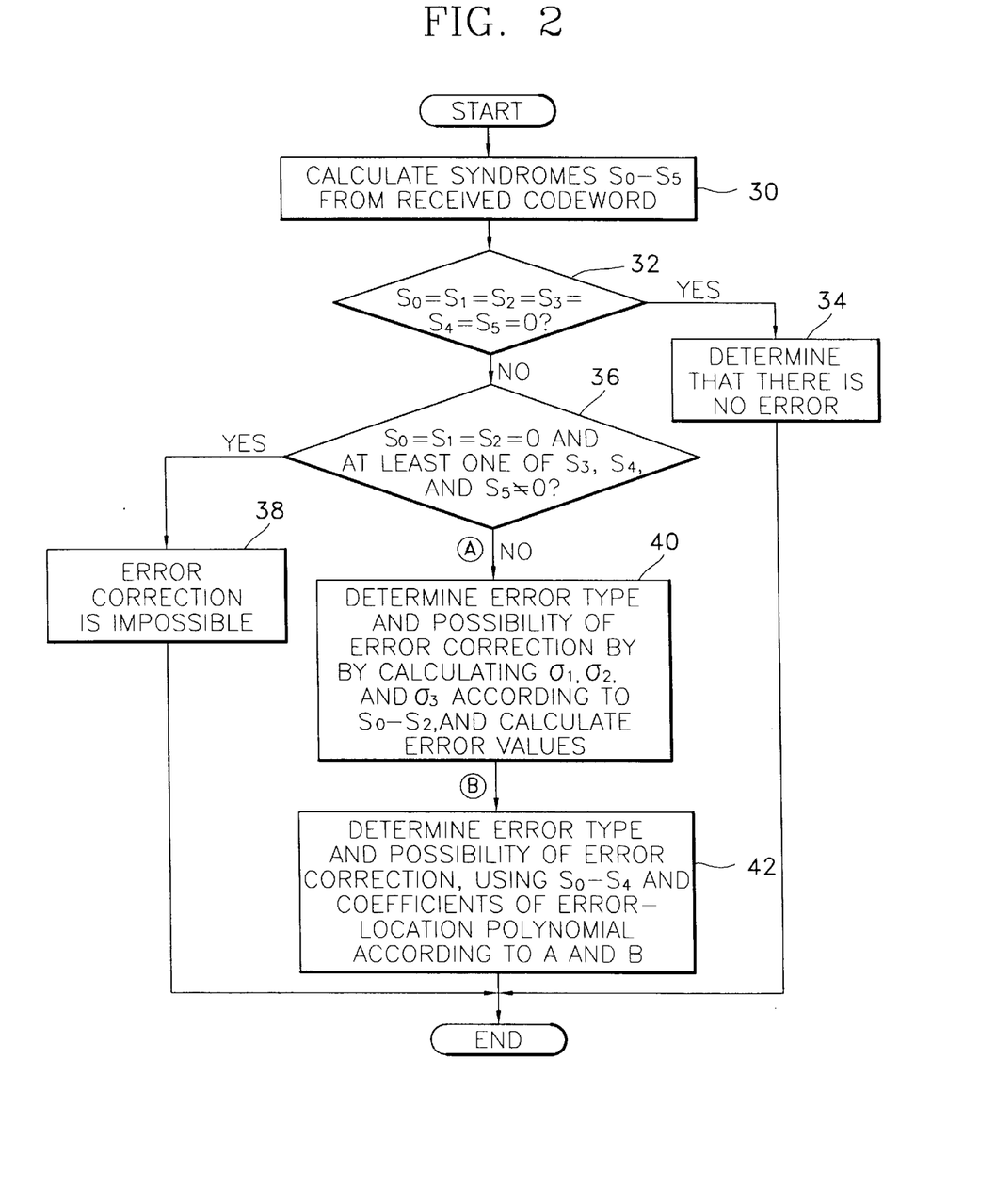
FIG. 2 is a flowchart outlining an error correcting method according to an embodiment of the present invention.

Referring to FIG. 2, an error correction process includes a step 30 for calculating syndromes and steps 32 to 42 for determining from the calculated syndromes, an error type and the possibility of error correction.

For the triple-error correction/6-erasure correction Reed Solomon (RS) code, six syndromes $S_0, S_1, S_2, S_3, S_4,$ and $S_5$ are calculated from a received codeword $R(x)$ as in the following Equation 7. Here, an erasure indicates a type of error whose location is known but whose value is unknown.

$$S_0 = e_i + e_j + e_k + e_l + e_m + e_n$$

$$S_1 = e_i\alpha^i + e_j\alpha^j + e_k\alpha^k + e_l\alpha^l + e_m\alpha^m + e_n\alpha^n$$

$$S_2 = e_i\alpha^{2i} + e_j\alpha^{2j} + e_k\alpha^{2k} + e_l\alpha^{2l} + e_m\alpha^{2m}e_n\alpha^{2n}$$

$$S_3 = e_i\alpha^{3i} + e_j\alpha^{3j} + e_k\alpha^{3k} + e_l\alpha^{3l} + e_m\alpha^{3m} + e_n\alpha^{3n} \quad \text{Equations 7}$$

$$S_4 = e_i\alpha^{4i}e_j\alpha^{4j}e_k\alpha^{4k} + e_l\alpha^{4l} + e_m\alpha^{4m} + e_n\alpha^{4n}$$

$$S_5 = e_i\alpha^{5i} + e_j\alpha^{5j} + e_k\alpha^{5k} + e_l\alpha^{5l} + e_m\alpha^{5m} + e_n\alpha^{5n}$$

Step 32 determines whether all of the syndromes $S_0$ to $S_5$ are zeros. If all of the syndromes $S_0$ to $S_5$ are zeros, the process branches to step 34, and there is no error. If all of syndromes $S_0$ to $S_5$ are not zeros, the process branches from step 32 to step 36.

Step 36 determines whether syndromes $S_0$, $S_1$, and $S_2$ are all zeros, and at least one of syndromes $S_3$, $S_4$, and $S_5$ is not zero. If syndromes $S_0$, $S_1$, and $S_2$ are all zeros, and at least one of syndromes $S_3$, $S_4$, and $S_5$ is not zero, error correction is impossible, and the process branches to step 38. That is, more than three errors are generated, and the received error correction code is insufficient for correcting all of the errors. However, if one or more syndromes $S_0$, $S_1$, and $S_2$ is not zero, or syndromes $S_3$, $S_4$, and $S_5$ are all zeros, the condition evaluated in step 36 is not satisfied, and the process branches to step 40. In step 40, the coefficients of an error-location polynomial are calculated differently, depending on whether two of the syndromes $S_0$, $S_1$, and $S_2$ are zeros or not. Step 40 also determines error locations from the differently calculated error coefficients, an error type and the possibility of error correction from a range of error locations, and error values.

Figure 3:
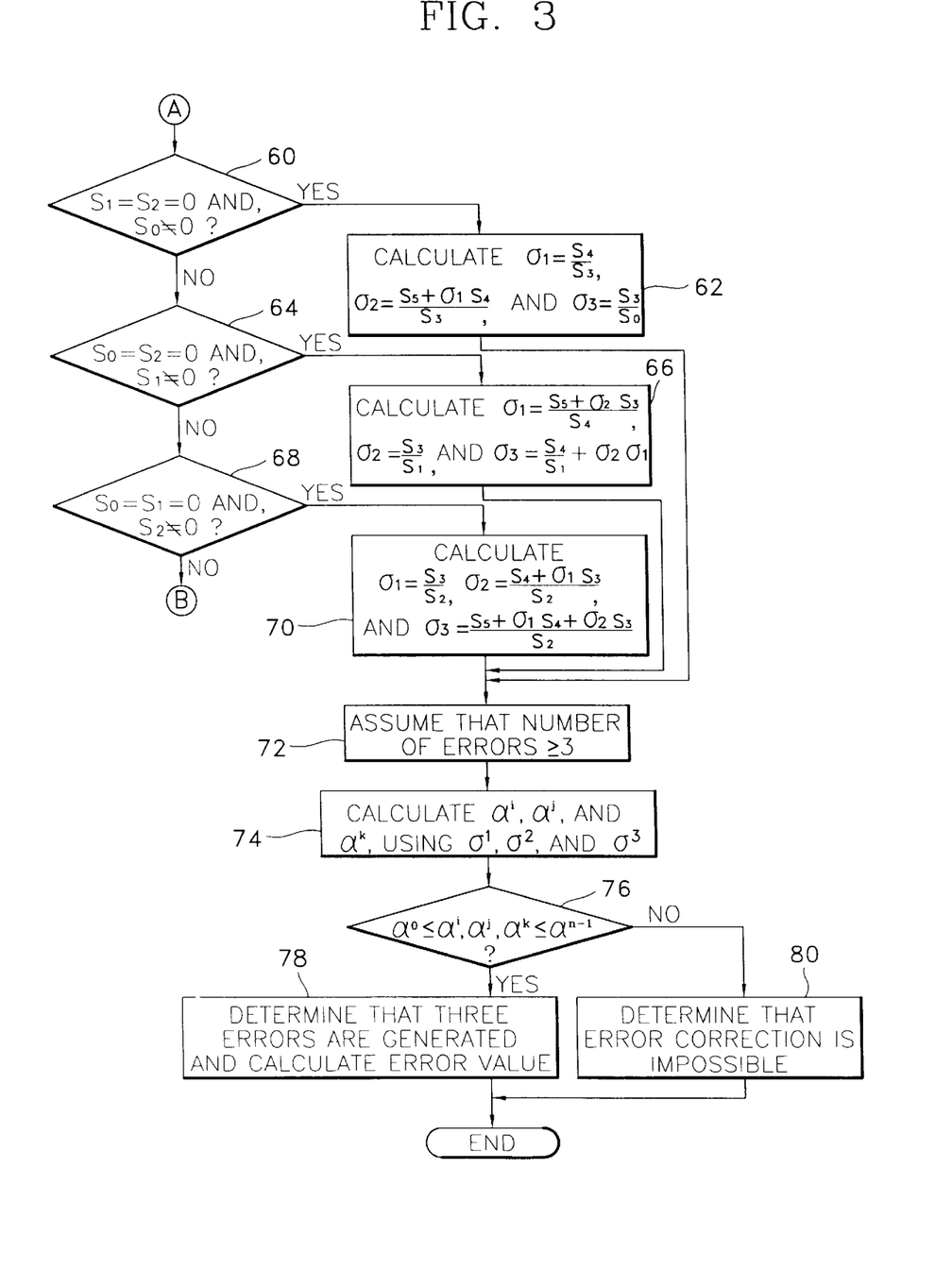
FIG. 3 is a detailed flowchart outlining step 40 of FIG. 2.

FIG. 3 is a flowchart of step 40 of FIG. 2 according to an embodiment of the invention. Step 40 of FIG. 3 includes steps 60, 64, and 68 for determining whether and which two of syndromes $S_0$, $S_1$, and $S_2$ are zeros, steps 62, 66, and 70 for calculating coefficients $\sigma_1$, $\sigma_2$, and $\sigma_3$ of the error location polynomial for each case in which only one of syndromes $S_0$, $S_1$, and $S_2$ are non-zero, and steps 72, 74, 76, 78, and 80 for determining an error type according to the number of generated errors, the possibility of error correction, and if possible the error values.

If the condition evaluated in step 36 is not satisfied, that is, if all of the syndromes $S_0$, $S_1$, and $S_2$ are not zeros, or syndromes $S_3$, $S_4$, and $S_5$ are all zeros, step 60 determined whether syndromes $S_1$ and $S_2$ are zeros and syndrome $S_0$ is not zero. If syndrome $S_1$ and syndrome $S_2$ are zeros and syndrome $S_0$ is not zero, step 62 calculates the coefficients $\sigma_1$, $\sigma_2$, and $\sigma_3$ of the error location polynomial using Equations 8.

$$\sigma_1 = \frac{S_4}{S_3} \quad \text{Equations 8}$$

$$\sigma_2 = \frac{S_5 + \sigma_1 S_4}{S_3}$$

-continued $$\sigma_3 = \frac{S_3}{S_0}$$

However, if both syndromes $S_1$ and $S_2$ are not zeros or syndrome $S_0$ is zero, the process branches from step 60 to step 64 and determines whether syndromes $S_0$ and $S_2$ are zeros and syndrome $S_1$ is not zero. If syndromes $S_0$ and $S_2$ are zeros and syndrome $S_1$ is not zero, step 66 calculates coefficients $\sigma_1$, $\sigma_2$, and $\sigma_3$ of the error location polynomial using Equations 9.

$$\sigma_1 = \frac{S_5 + \sigma_2 S_3}{S_4} \quad \text{Equations 9}$$

$$\sigma_2 = \frac{S_3}{S_1}$$

$$\sigma_3 = \frac{S_4}{S_1} + \sigma_2 \sigma_1$$

However, if syndromes $S_0$ and $S_2$ are not zeros or syndrome $S_1$ is zero, the process branches from step 64 to step 68 and determines whether syndromes $S_0$ and $S_1$ are zeros and syndrome $S_2$ is not zero. If both syndromes $S_0$ and $S_1$ are zeros and syndrome $S_2$ is not zero, step 70 calculates coefficients $\sigma_1$, $\sigma_2$, and $\sigma_3$ of an error location polynomial using Equations 10.

$$\sigma_1 = \frac{S_3}{S_2} \quad \text{Equations 10}$$

$$\sigma_2 = \frac{S_4 + \sigma_1 S_3}{S_2}$$

$$\sigma_3 = \frac{S_5 + \sigma_1 S_4 + \sigma_2 S_3}{S_2}$$

If two of syndromes $S_0$, $S_1$, and $S_2$ are zeros and the other is not zero, step 62, 66, or 70 calculates coefficients $\sigma_1$, $\sigma_2$, and $\sigma_3$. The process then proceeds from step 62, 66, or 70 under the assumption of step 72, that there are three errors. Under this assumption, step 74 calculates error locations $\alpha i$, $\alpha j$, and $\alpha k$, using the error location polynomial and the coefficients calculated in steps 62, 66, or 70. Any desired method can be used for calculating the error locations. An exemplary method is disclosed in Korea Patent Publication No. 94-10545.

Korea Patent Publication No. 92-18409 discloses a triple-error correction method that applies the following concept to an error-location polynomial. In particular, a polynomial of the third degree such as Equation 11 can be converted to the form of Equation 12.

$$f(x) = x^3 + cx^2 + bx + a = 0 \quad \text{Equation 11}$$

$$f(Z) = Z^3 + Z + \theta = 0 \quad \text{Equation 12}$$

where $\theta$ is a constant.

For example, replacing x with $(mZ+n)$ changes Equation 11 to Equation 13.

$$(mZ+n)^3 + c(mZ+n)^2 + b(mZ+n) + a = 0 \quad \text{Equation 13}$$

Expanding and then collecting terms of Equation 13 provides Equation 14 which becomes Equation 15.

$$(m^3Z^3 + 3m^2Z^2n + mZn^2 + n^3) + c(m^2Z^2 + 2mZn + n^2) + b$$

$$(mZ+n)+a=0 \qquad \text{Equation 14}$$

$$Z^3(m^3)+Z^2(3m^2n+cm^2)+Z(3mn^2+2cmn+bm)+(n^3+cn^2+bn+a)=0 \qquad \text{Equation 15}$$

Dividing Equation 15 by $m^3$ makes the coefficient of the highest degree-term $Z^3$ equal to 1 and provides Equation 16.

$$Z^3 + Z^2 + \frac{(3m^2n + cm^2)}{m^3} + Z\frac{(3mn^2 + 2cmn + bm)}{m^3} + \frac{(n^3 + cn^2 + bn + a)}{m^3} = 0 \qquad \text{Equation 16}$$

If variables m and n satisfy the conditions of Equations 17, Equation 16 simplifies to the form of Equation 12.

$$3m^2n + cm^2 = 0$$
$$3mn^2 + 2cmn + bm = m^3 \qquad \text{Equations 17}$$

Equations 17 are equivalent to Equations 18 by operating the root of a polynomial in finite field of Galois field GF(q).

$$m^2n + cm^2 = m^2(n + c) = 0$$
$$mn^2 + bm = m^3 \qquad \text{Equations 18}$$

Therefore, m and n can be expressed with respect to a, b, and c as $$m = (c^2 + b)^{\frac{1}{2}}$$
$$n = c \qquad \text{Equations 19}$$

and $\theta$ of Equation 12 is expressed as $$\theta = \frac{(n^3 + cn^2 + bn + a)}{m^3} = \frac{(bc + a)}{(c^2 + b)^{\frac{3}{2}}} \qquad \text{Equation 20}$$

The above relationships for polynomials of order 3 can be applied to Equation 3, where coefficients $\sigma_1$, $\sigma_2$, and $\sigma_3$ are respectively equal to coefficients c, b, and a.

Korea Patent Application No. 92-18409 and the following describe how to use the above relationships to determine the error locations, the number of errors, and the error values. First, the roots $Z_1$, $Z_2$, and $Z_3$ of Equation 12 for all possible $\theta$ values are obtained and stored in a memory at addresses having a functional relationship to values $\theta$. In an exemplary embodiment, roots $Z_1$, $Z_2$, and $Z_3$ are stored in a ROM table. Equation 12 is a conversion of Equation 3 which is a triple-error location polynomial. From syndromes $S_1$ to $S_5$ calculated in step 30, the number of errors is obtained by constructing from the calculated syndromes a matrix M having the maximum dimension such that det[M]≠0. For triple-error correction, the number of errors is obtained by determining det[M]≠0 in a 3×3 matrix M, which is expressed as $$M = \begin{bmatrix} S_2, & S_1, & S_0 \\ S_3, & S_2, & S_1 \\ S_4, & S_3, & S_2 \end{bmatrix} \qquad \text{Equation 21}$$

$$[\det]M = S_2S_2S_2 + S_1S_1S_4 + S_0S_3S_3 + S_0S_2S_4 +$$

-continued
$$S_1S_2S_3 + S_1S_2S_3 \neq 0$$
$$= S_2S_2S_2 + S_1S_1S_4 + S_0S_3S_3 + S_0S_2S_4 \neq 0$$

Coefficients $\sigma_1$, $\sigma_2$, and $\sigma_3$ of an error location polynomial are known from 62, 66, or 70. From coefficients $\sigma_1$, $\sigma_2$, and $\sigma_3$, the values of constants $k_1$ and $k_2$ are obtained according to Equations 22 and 23 respectively, and then the value of $\theta$ is obtained according to Equation 24.

$$k_1 = \sigma_1^2 + \sigma_2 \qquad \text{Equation 22}$$

$$k_2 = \sigma_1\sigma_2 + \sigma_3 \qquad \text{Equation 23}$$

$$\theta = \frac{k_2}{(k_1)^{\frac{3}{2}}}, \qquad \theta = \frac{(\sigma_1\sigma_2 + \sigma_3)}{(\sigma_1^2 + \sigma_2)^{\frac{3}{2}}} \qquad \text{Equation 24}$$

Then, an address corresponding to value $\theta$ obtained from Equation 24, and the roots $Z_1$, $Z_2$, and $Z_3$ of Equation 12 are read from that address in the look-up table in memory. Roots $Z_1$, $Z_2$, and $Z_3$ are converted into three roots $\alpha^1$, $\alpha^2$, and $\alpha^3$ of error location polynomial of Equation 3 using Equation 25.

$$\alpha^1 = (k_1)^{\frac{1}{2}} \cdot Z_1 + \sigma_1$$
$$\alpha^2 = (k_1)^{\frac{1}{2}} \cdot Z_2 + \sigma_1 \qquad \text{Equations 25}$$
$$\alpha^3 = (k_1)^{\frac{1}{2}} \cdot Z_3 + \sigma_1$$

After step 74, step 76 determines whether the error locations are in the codeword. That is, step 76 determines whether $\alpha^0 \leq \alpha^i$, $\alpha^j$, $\alpha^k \leq \alpha^{n-1}$ (n indicates a codeword length). If the error locations are in the codeword, the assumption of step 72, that three errors are generated, is confirmed, and step 78 calculates error values using a general method, for example, the method disclosed in Korea Patent Publication No. 94-10545. However, if the error locations are not in the codeword or any of the conditions of $\alpha^i = \alpha^j$, $\alpha^j = \alpha^k$, or $\alpha^k = \alpha^i$ is satisfied, it is determined that error correction is impossible in step 80. That is, more than three errors are generated, and the errors cannot be corrected using available information. Otherwise step 78 determines three error values $e_1$, $e_2$, and $e_3$. An error value $e_j$ is calculated by $$e_j = \frac{\Omega(\alpha^{*j})}{\prod_{i=1, i \neq j}^{3} (1 + \alpha^{*i}\alpha^{*j})} \qquad \text{Equation 26}$$

Here, error values for three error locations $\alpha^1$, $\alpha^2$, and $\alpha^3$ are $e_1$, $e_2$, and $e_3$, and an error estimating polynomial $\Omega(x)$ is given as $$\Omega(x) = \sigma_3 + (\sigma_3S_0 + \sigma_2)x + (\sigma_3S_1 + \sigma_2S_0 + \sigma_1)x^2 + (\sigma_3S_2 + \sigma_2S_1 + \sigma_1S_0 + 1)x^3 \qquad \text{Equation 27}$$

Figure 4:
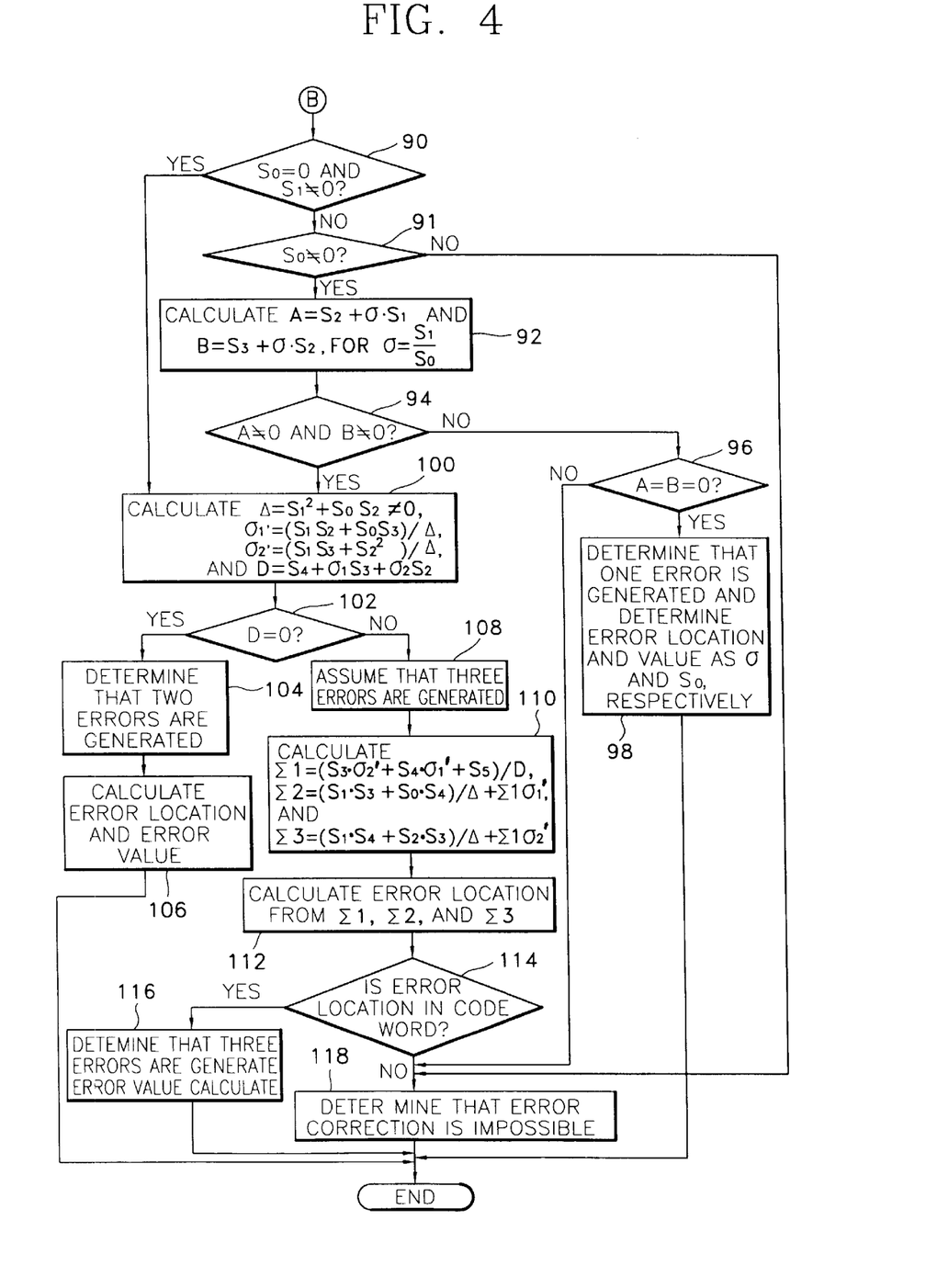
FIG. 4 is a detailed flowchart outlining step 42 of FIG. 2.

Step 40 handles the cases where exactly two out of the three syndromes $S_0$, $S_1$, and $S_2$ are zero. In this case, the error correction process is completed and ends in step 40. If it is not the case that exactly two out of the three syndromes $S_0$, $S_1$, and $S_2$ are zeros, the error correction process branches from step 40 (i.e., from step 68 in FIG. 3) to step 42. FIG. 4 is a flowchart of an embodiment of step 42. In FIG. 4, step 42 includes steps 90, 91, and 92 for obtaining syndrome equations A and B according to the values of syndromes $S_0$ and $S_1$, and steps 94 to 118 for differently obtaining the coefficients of the error location polynomial depending on whether syndrome equations A and B are zeros or not, and determining an error type and the possibility of error correction using coefficients $\sigma_1$, $\sigma_2$, and $\sigma_3$ and syndromes $S_0$ to $S_4$.

If conditions evaluated in steps 60, 64, and 68 are not satisfied, step 90 determines whether syndrome $S_0$ is zero and syndrome $S_1$ is not zero. If syndrome $S_0$ is not zero or syndrome $S_1$ is zero, step 91 determines whether syndrome $S_0$ is not zero. If syndromes $S_0$ and $S_1$ are zeros in step 91, error correction is impossible, and the process branches from step 91 two step 118. If syndrome $S_0$ is not zero, step 92 calculates first and second syndrome equations A and B of Equations 28.

$$A = S_2 + \sigma \cdot S_1 \qquad \text{Equations 28}$$
$$B = S_3 + \sigma \cdot S_2$$

where $\sigma$ is $S_1/S_0$.

After step 92, step 94 determines whether both of the calculated syndrome equations A and B are not zero. If either A or B is zero, that is, the condition evaluated in step 94 is not satisfied, step 96 determines whether both A and B are zeros. If both A and B are zeros, there is only one error, and the process branches from step 96 to step 98 where an error location and an error value are determined as $\sigma$ (i.e., $S_1/S_2$) and syndrome $S_0$, respectively. However, if only one of syndrome equations A and B is zero in step 96, error correction is impossible, and the process branches from step 96 to step 118.

If both A and B are not zero or syndrome $S_0$ is zero and syndrome $S_1$ is not zero, two or more errors are generated, and the process branches from step 94 or 90 to step 100. Step 100 calculates coefficients $\sigma 1'$ and $\sigma 2'$ of an error location polynomial and a variable D according to Equations 29.

$$\Delta = S_1^2 + S_0 \cdot S_2 \neq 0 \qquad \text{Equations 29}$$
$$\sigma 1' = (S_1 \cdot S_2 + S_0 \cdot S_3)/\Delta$$
$$\sigma 2' = (S_1 \cdot S_3 + S_2^2)/\Delta$$
$$D = S_4 + \sigma 1 \cdot S_3 + \sigma 2 \cdot S_2.$$

After step 100, step 102 determines whether variable D is zero to determine an error type, that is, the number of errors. If variable D is zero, the process branches to step 104 for handling of two errors, and step 106 determines error locations and error values for the two errors using a general method. If variable D is not zero, the process branches from step 102 to step 108 and assumes three errors. To confirm that there are three errors, step 110 calculates the coefficients $\Sigma 1$, $\Sigma 2$, and $\Sigma 3$ of an error location polynomial using Equation 30.

$$\Sigma 1 = (S_3 \cdot \sigma 2' + S_4 \cdot \sigma 1' + S_5)/D \qquad \text{Equations 30}$$
$$\Sigma 2 = (S_1 \cdot S_3 + S_0 \cdot S_4)/\Delta + \Sigma 1 \cdot \sigma 1'$$
$$\Sigma 3 = (S_1 \cdot S_4 + S_2 \cdot S_3)/\Delta + \Sigma 1 \cdot \sigma 2'$$

After step 110, step 112 calculates error locations from the coefficients $\Sigma 1$, $\Sigma 2$, and $\Sigma 3$ using a general method, especially, the aforementioned method disclosed in Korea Patent Publication No. 94-10545. Step 114 determines whether the calculated error locations are in a codeword. If they are not, error correction is impossible, and the process branches from step 114 to step 118. However, if they are, there are three errors, and their values are calculated in step 116 using a general method such as those well known in the art.

Figure 5:
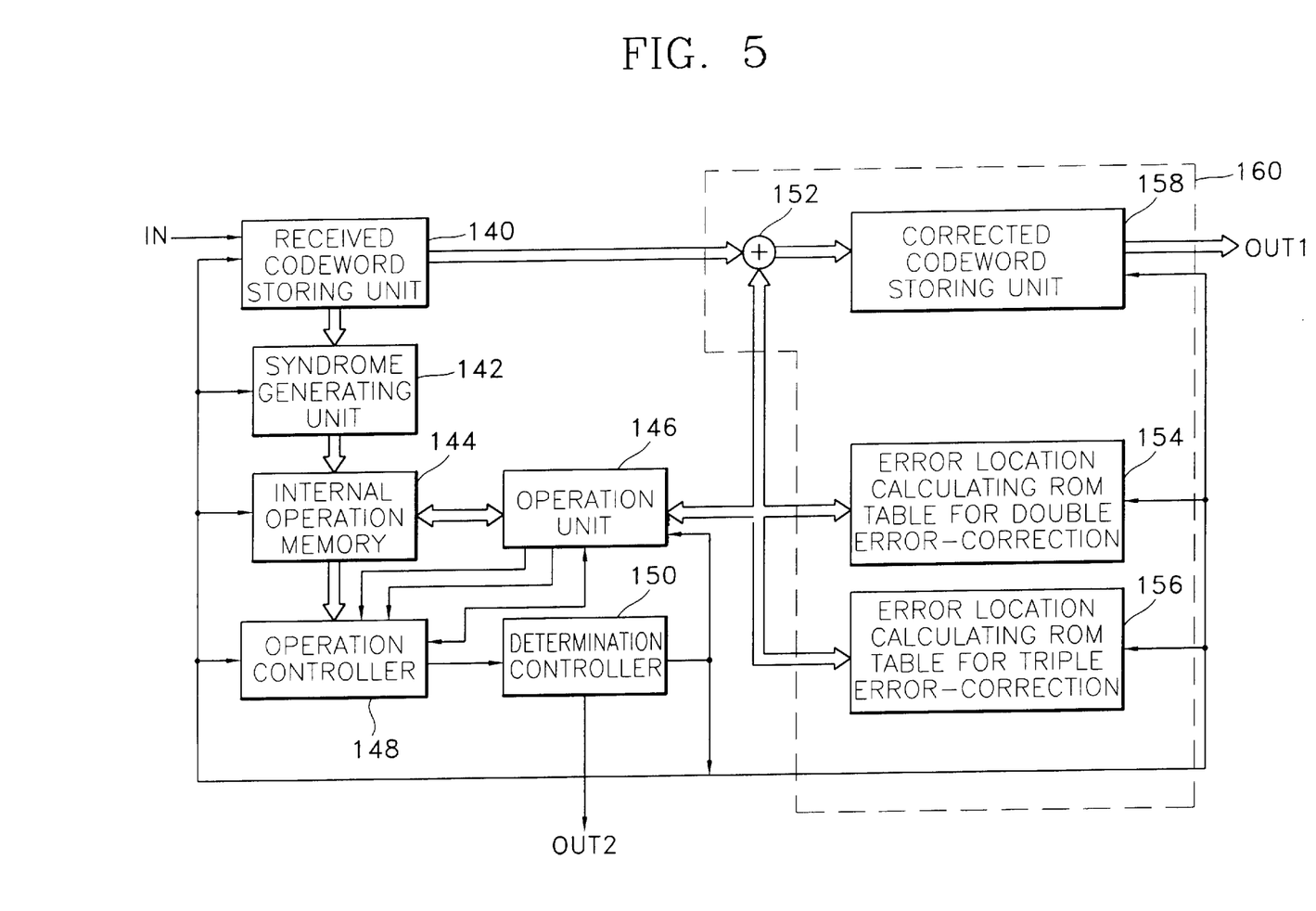
FIG. 5 is a block diagram of an error correcting device according to the present invention.

FIG. 5 is a block diagram of an error correcting device in accordance with an embodiment of the present invention. In FIG. 5, the error correcting device has a received codeword storing unit 140, a syndrome generator 142, an internal operation memory 144, an operation unit 146, an operation controller 148, a determination controller 150, and an error correcting unit 160. Error correcting unit 160 includes an error location calculating ROM table 154 for double-error correction, an error location calculating ROM table 156 for triple-error correction, a corrected codeword storage 158, and an adder 152. Each unit 140 to 158 of FIG. 5 is implemented as special purpose circuits for performing the functions described below. Alternatively, the error correcting device of FIG. 5 could be implemented in a general purpose computer in which received codeword storing unit 140, internal operation memory 144, ROM tables 154 and 156, and corrected codeword storage 158 are portions of memory and syndrome generator 142, operation unit 146, operation controller 148, determination controller 150, and adder 152 are implemented in software or firmware.

Received codeword storing unit 140 of FIG. 5 latches and stores a codeword received from a source medium (not shown) or other error correcting devices (not shown) via an input terminal IN. Syndrome generator 142 receives the codeword latched from received codeword storing unit 140 and outputs generated syndromes $S_0$ to $S_5$ to internal operation memory 144. Internal operation memory 144 temporarily stores the syndromes from syndrome generator 142 and interim operated values generated during operations in operation unit 146.

Operation controller 148 receives the syndromes stored in internal operation memory 144 and generates a first control signal when both syndromes $S_1$ and $S_2$ are zeros and syndrome $S_0$ is not zero, a second control signal when both syndromes $S_0$ and $S_2$ are zeros and syndrome $S_1$ is not zero, a third control signal when both syndromes $S_0$ and $S_1$ are zeros and syndrome $S_2$ is not zero, a fourth control signal when two of the syndromes $S_0$, $S_1$, and $S_2$ are not zeros and syndrome $S_0$ is not zero or syndrome $S_1$ is zero, a fifth control signal when both syndrome equations A and B are not zero, a sixth control signal when value D is zero, and a seventh control signal when value D is not zero. Operation controller 148 outputs the control signals to operation unit 146.

Operation unit 146 uses the syndromes in internal operation memory 144 in determining coefficients $\sigma 1$, $\sigma 2$, and $\sigma 3$. In particular, operation unit 146 determines coefficients $\sigma 1$, $\sigma 2$, and $\sigma 3$ according to Equations 8 in response to the first control signal from operation controller 148, according to Equations 9 in response to the second control signal, and according to Equations 10 in response to the third control signal. Operation unit 146 also determines syndrome equations A and B from Equations 28 in response to the fourth control signal, and values $\sigma 1'$, $\sigma 2'$, and D according to Equations 29 in response to the fifth control signal. In addition, operation unit 146 calculates an error location and an error value from $\sigma 1'$ and $\sigma 2'$ in response to the sixth control signal, coefficients $\Sigma 1$, $\Sigma 2$, and $\rho 3$ of an error location polynomial as in Equation 30 in response to the seventh control signal, and an error location and an error value from the coefficients Σ1, Σ2, and Σ3. The final operated values calculated in operation unit 146 are temporarily stored in the internal operation memory 144.

The exemplary operations of operation controller 148 and operation unit 146 are described. Operation controller 148 outputs the first control signal to operation unit 146 if syndromes $S_1$ and $S_2$ received from internal operation memory 144 are zeros and syndrome $S_0$ is not zero. Operation unit 146 calculates σ1, σ2, and σ3 as in Equations 8 by iteratively operating in response to the first control signal. Here, operation unit 146 has a numerical logic operator (not shown) and an error correction code (ECC) controller. The ECC controller performs divisions using inverse circuits and calculates coefficients by iteratively outputting the results to the numerical logic operator.

Determination controller 150 of FIG. 5 determines that there is no error if the syndromes $S_0$ to $S_5$ are all zeros, controls received codeword storing unit 140, and outputs data to adder 152. On the other hand, if syndromes $S_0$, $S_1$, and $S_2$ are all zeros and syndromes $S_3$, $S_4$, and $S_5$ are not all zeros, determination controller 150 determines that error correction is impossible, and outputs via an output terminal OUT2 a message indicating that error cannot be corrected.

Determination controller 150 determines whether the error locations obtained from σ1, σ2, and σ3 in operation unit 146 are all in a codeword and determines that three errors are generated if they are. On the other hand, if they are not, it outputs a corresponding signal and message to error correcting unit 160 and an output terminal OUT2 upon determining that error correction is impossible.

Meanwhile, if syndrome $S_0$ is not zero or syndrome $S_1$ is zero, determination controller 150 reads values A and B from internal operation memory 144 and directs error correcting unit 160 to perform a corresponding error correction upon determining that an error is generated, if both A and B are zeros. However, if both A and B are not zero, determination controller 150 determines whether D is zero. Determination controller 150 outputs corresponding control signals to error correcting unit 160 upon determining that there are two errors if D is zero or that there are three errors if D is not zero.

Error location calculating ROM table 154 for double-error correction in error correcting unit 160 receives the difference between exponents for two error locations and outputs a pattern corresponding to the received difference between the exponents. Similarly, error location calculating ROM table 156 for triple-error correction receives the differences among exponents for three error locations and outputs a pattern corresponding to the received differences among exponents.

Adder 152 adds the pattern output from the error location calculating ROM table for double-error or triple-error correction 154 or 156 to data output from received codeword storing unit 140 and outputs the added data to corrected codeword storage 158 as error-corrected data. Corrected codeword storage 158 outputs the stored error-corrected data via the output terminal OUT1 under the control of determination controller 150.

As described above, error correcting methods and devices in accordance with embodiments of the invention remarkably reduce an operation time as compared with a conventional coefficient calculating method, since the coefficients of an error location polynomial are obtained by analyzing syndrome values. They also increase an error correction rate, and thus rapidly and stably correct errors since the number of errors are determined in advance and it is determined whether error correction is possible as compared with error number decision equations disclosed in Korea Patent Publication Nos. 94-4980, 94-10545, and 95-34202.

What is claimed is:

1. An error correcting method, comprising the steps of:
   (a) calculating syndromes $S_0$ to $S_5$ from a received codeword from the data stream;
   (b) determining whether the syndromes $S_0$ to $S_5$ are all zeros;
   (c) determining that there is no error in the received codeword if the syndromes $S_0$ to $S_5$ are all zeros;
   (d) determining whether the syndromes $S_0$, $S_1$, and $S_2$ are zeros and at least one of the syndromes $S_3$, $S_4$, and $S_5$ is not zero;
   (e) determining that error correction is impossible if the syndromes $S_0$, $S_1$, and $S_2$ are zeros and at least one of the calculated the syndromes $S_3$, $S_4$, and $S_5$ is not zero;
   (f) differently calculating coefficients σ1, σ2, and σ3 of an error-location polynomial, depending on whether two of the syndromes $S_0$, $S_1$, and $S_2$ are zeros and the other is not zero, if all of the syndromes $S_0$, $S_1$, and $S_2$ are not zeros or the syndromes $S_3$, $S_4$, and $S_5$ are all zeros, determining an error type and the possibility of error correction depending on whether error locations calculated from the calculated coefficients are in a codeword and calculating error values; and
   (g) determining an error type and the possibility of error correction using the syndromes $S_0$ to $S_4$ and the coefficients of the error location polynomial calculated depending on whether first and second syndrome equations obtained using the syndromes $S_0$ to $S_3$ which are calculated according to the values of the syndromes $S_0$ and $S_1$ are zeros if two of the syndromes $S_0$ to $S_2$ are not zeros in the step (f), and calculating error locations and values.

2. The method of claim 1, wherein the step (f) comprises the steps of:
   (f1) determining whether both of the syndromes $S_1$ and $S_2$ are zeros and the syndrome $S_0$ is not zero, if the syndromes $S_0$, $S_1$, and $S_2$ are not zeros or if the syndromes $S_3$, $S_4$, and $S_5$ are zeros;
   (f2) calculating the coefficients σ1, σ2, and σ3 of the error location polynomial using the following equation if both of the syndromes $S_1$ and $S_2$ are zeros and syndrome $S_0$ is not zero:

$$\sigma_1 = \frac{S_4}{S_3}$$

$$\sigma_2 = \frac{S_5 + \sigma_1 S_4}{S_3}$$

$$\sigma_3 = \frac{S_3}{S_0}$$

f3) determining whether both of the syndromes $S_0$ and $S_2$ are zeros and the syndrome $S_1$ is not zero if both of the syndromes $S_1$ and $S_2$ are not zeros or the syndrome $S_0$ is zero;
   (f4) calculating the coefficients, $\sigma_1$, $\sigma_2$, and $\sigma_3$ of the error location polynomial using the following equation if both of the syndromes $S_0$ and $S_2$ are zeros and the syndrome $S_1$ is not zero:

$$\sigma_1 = \frac{S_5 + \sigma_2 S_3}{S_4}$$

$$\sigma_2 = \frac{S_3}{S_1}$$

$$\sigma_3 = \frac{S_4}{S_1} + \sigma_2 \sigma_1$$

(f5) determining whether both of the syndromes $S_0$ and $S_1$ are zeros and the syndrome $S_2$ is not zero if both of the syndromes $S_0$ and $S_2$ are not zeros or the syndrome $S_1$ is zero;
   (f6) calculating the coefficients σ1, σ2, and σ3 of the error-location polynomial using the following equation if both of the syndromes $S_0$ and $S_1$ are zeros and the syndrome $S_2$ is not zero:

$$\sigma_1 = \frac{S_3}{S_2}$$

$$\sigma_2 = \frac{S_4 + \sigma_1 S_3}{S_2}$$

$$\sigma_3 = \frac{S_5 + \sigma_1 S_4 + \sigma_2 S_3}{S_2}$$

(f7) assuming that at least three errors are generated after the steps (f2), (f4) and (f6);
   (f8) calculating the error locations using the coefficients σ1, σ2, and σ3 calculated in the steps (f2), (f4) and (f6);
   (f9) determining whether the error locations are in a codeword;
   (f10) determining that three errors are generated if the error locations are in the codeword;
   (f11) determining that error correction is impossible if the error locations are not in the codeword; and
   (f12) performing the step (g) if two of the syndromes $S_0$, $S_1$, and $S_2$ are not zeros.

3. The method of claim 2, further comprising the step of calculating the error values after the step (f10).

4. The method of claim 1, wherein the step (g) comprises the steps of:
   (g1) determining whether the syndrome $S_0$ is zero and the syndrome $S_1$ is not zero if two of the syndromes $S_0$, $S_1$, and $S_2$ are not zeros;
   (g2) determining whether the syndrome $S_0$ is not zero if the syndrome $S_0$ is not zero or the syndrome $S_1$ is zero:
   (g3) calculating the first and second syndrome equations A and B using the following equations if the syndrome $S_0$ is not zero:

$$A = S_2 + \sigma \cdot S_1$$

$$B = S_3 + \sigma \cdot S_2$$

where σ is $S_1/S_0$;
   (g4) determining whether both syndrome equations A and B are not zero;
   (g5) calculating coefficients σ1' and σ2' of the error-location polynomial and a value D using the following equation if both of the syndrome equations A and B are not zero, or the syndrome $S_0$ is zero and the syndrome $S_1$ is not zero:

$$\sigma1'=(S_1 \cdot S_2+S_0 \cdot S_3)/\Delta$$

$$\sigma2'=(S_1 \cdot S_3+S_2^2)/\Delta$$

$$D=S_4+\sigma1 \cdot S_3+\sigma2 \cdot S_2$$

where, $\Delta=S_1^2+S_0 \cdot S_2 \neq 0$;

(g6) determining whether both of the syndrome equations A and B are zeros if at least one of the syndrome equations A and B is zero;

error (g7) determining that an error is generated and determining an error location and an error value as $\sigma$ and the syndrome $S_0$, respectively, if both of the syndrome equations A and B are zeros;

(g8) determining that error correction is impossible if either of the syndrome equations A and B is zero;

(g9) determining whether the value D obtained in the step (g3) is zero;

(g10) determining that two errors are generated if the value D is zero;

(g11) determining that three errors are generated if the value D is not zero;

(g12) calculating coefficients $\Sigma1$, $\Sigma2$, and $\Sigma3$ of the error-location polynomial using the following equation:

$$\Sigma1=(S_3 \cdot \sigma2'+S_4 \cdot \sigma1'+S_5)/D$$

$$\Sigma2=(S_1 \cdot S_3+S_0 \cdot S_4)/\Delta+\Sigma1 \cdot \sigma1'$$

$$\Sigma3=(S_1 \cdot S_4+S_2 \cdot S_3)/\Delta+\Sigma1 \cdot \sigma2'$$

(g13) calculating the error locations from the coefficients $\rho1$, $\Sigma2$, and $\Sigma3$;

(g14) determining whether the error locations obtained in step (g13) are in the codeword;

(g15) determining that three errors are generated if the error locations are in the codeword; and (g16) performing the step (g8) if the error locations are not in the codeword.

5. The error correcting method of claim 2, wherein the step (g) comprises the steps of:

(g1) determining whether the syndrome $S_0$ is zero and the syndrome $S_1$ is not zero if two of the syndromes $S_0$, $S_1$, and $S_2$ are not zeros;

(g2) determining whether the syndrome $S_0$ is not zero if the syndrome $S_0$ is not zero or the syndrome $S_1$ is zero:

(g3) calculating the first and second syndrome equations A and B using the following equations if the syndrome $S_0$ is not zero:

$$A=S_2+\sigma \cdot S_1$$

$$B=S_3+\sigma \cdot S_2$$

where $\sigma$ is $S_1/S_0$;

(g4) determining whether both of the syndrome equations A and B are not zero;

(g5) calculating coefficients $\sigma1'$ and $\sigma2'$ of the error-location polynomial and a value D using the following equations if both of the syndrome equations A and B are not zero, or the syndrome $S_0$ is zero and the syndrome $S_1$ is not zero:

$$\sigma1'=(S_1 \cdot S_2+S_0 \cdot S_3)/\Delta$$

$$\sigma2'=(S_1 \cdot S_3+S_2^2)/\Delta$$

$$D=(S_4+\sigma1 \cdot S_3+\sigma2 \cdot S_2$$

where, $\Delta=S_1^2+S_0 \cdot S_2 \neq 0$.

(g6) determining whether both the syndrome equations A and B are zeros if at least one of the syndrome equations A and B is zero;

(g7) determining that an error is generated and determining an error location and an error value as $\sigma$ and the syndrome $S_0$, respectively, if both of the syndrome equations A and B are zeros;

(g8) determining that error correction is impossible if either of the syndrome equations A and B is zero;

(g9) determining whether the value D obtained in the step (g3) is zero;

(g10) determining that two errors are generated if the value D is zero;

(g11) determining that three errors are generated if the value D is not zero;

(g12) calculating coefficients $\Sigma1$, $\Sigma2$, and $\Sigma3$ of the error-location polynomial using the following equation:

$$\Sigma1=(S_3 \cdot \sigma2'+S_4 \cdot \sigma1'+S_5)/D$$

$$\Sigma2=(S_1 \cdot S_3+S_0 \cdot S_4)/\Delta+\Sigma1 \cdot \sigma1'$$

$$\Sigma3=(S_1 \cdot S_4+S_2 \cdot S_3)/\Delta+\Sigma1 \cdot \sigma2';$$

(g13) calculating the error locations from the coefficients $\Sigma1$, $\Sigma2$, and $\Sigma3$;

(g14) determining whether the error locations obtained in step (g13) are in the codeword;

(g15) determining that three errors are generated if the error locations are in the codeword; and (g16) performing the step (g8) if the error locations are not in the codeword.

6. The error correcting method as claimed in claim 3, wherein the step (g) comprises the steps of:

(g1) determining whether the syndrome $S_0$ is zero and the syndrome $S_1$ is not zero if two of the syndromes $S_0$, $S_1$, and $S_2$ are not zeros;

(g2) determining whether the syndrome $S_0$ is not zero if the syndrome $S_0$ is not zero or the syndrome $S_1$ is zero:

(g3) calculating the first and second syndrome equations A and B using the following equations if the syndrome $S_0$ is not zero:

$$A=S_2+\sigma \cdot S_1$$

$$B=S_3+\sigma \cdot S_2$$

where $\sigma$ is $S_1/S_0$;

(g4) determining whether both the syndrome equations A and B are not zero;

(g5) calculating coefficients $\sigma1'$ and $\sigma2'$ of the error-location polynomial and a value D using the following equation if both the syndrome equations A and B are not zero, or the syndrome $S_0$ is zero and the syndrome $S_1$ is not zero:

$$\sigma1'=(S_1 \cdot S_2+S_0 \cdot S_3)/\Delta$$

$$\sigma2'=(S_1 \cdot S_3+S_2{}^2)/\Delta$$

$$D=S_4+\sigma1 \cdot S_3+\sigma2 \cdot S_2$$

where, $\Delta=S_1{}^2+S_0 \cdot S_2 \neq 0$.

(g6) determining whether both the syndrome equations A and B are zeros if at least one of the syndrome equations A and B is zero;

(g7) determining that an error is generated and determining an error location and an error value as σ and the syndrome $S_0$, respectively, if both the syndrome A and B are zeros;

(g8) determining that error correction is impossible if either of the syndrome equations A and B is zero;

(g9) determining whether the value D obtained in the step (g3) is zero;

(g10) determining that two errors are generated if the value D is zero;

(g11) determining that three errors are generated if value D is not zero;

(g12) calculating coefficients Σ1, Σ2, and Σ3 of the error-location polynomial using the following equation:

$$\Sigma1=(S_3 \cdot \sigma2'+S_4 \cdot \sigma1'+S_5)/D$$

$$\Sigma2=(S_1 \cdot S_3+S_0 \cdot S_4)/\Delta+\Sigma1 \cdot \sigma1'$$

$$\Sigma3=(S_1 \cdot S_4+S_2 \cdot S_3)/\Delta+\Sigma1 \cdot \sigma2'$$

(g13) calculating the error locations from the coefficients Σ1, Σ2, and Σ3;

(g14) determining whether the error locations obtained in step (g13) are in the codeword;

(g15) determining that three errors are generated if the error locations are in the codeword; and (g16) performing the step (g8) if the error locations are not in the codeword.

7. The error correcting method of claim 4, further comprising the step of calculating the error locations and values from the coefficients σ1' and σ2' after the step (g10).

8. The error correcting method of claim 4, further comprising the step of obtaining the error values after the step (g15).

9. The error correcting method of claim 4, further comprising the step of determining that error correction is impossible if the syndrome $S_0$ is zero, in the step (g2).

10. A method for correcting errors in a digital data stream, comprising the steps of:

extracting a received codeword from the digital data stream;

calculating syndromes $S_0$ to $S_5$ from the received codeword;

if the syndromes $S_0$ to $S_5$ are all zeros, returning to step of extracting because there is no error in the received codeword;

if the syndromes $S_0$, $S_1$, and $S_2$ are zeros and at least one of the calculated the syndromes $S_3$, $S_4$, and $S_5$ is not zero, returning to step of extracting because errors in the received codeword are uncorrectable;

selecting a process from among a plurality of processes for determining coefficients σ1, σ2, and σ3 of an error-location polynomial wherein the process selected depends on which if any of the syndromes $S_0$, $S_1$, and $S_3$ are zeros;

executing the selected process to determine the coefficients σ1, σ2, and σ3; and using the coefficients and the syndromes to determine an error type, whether error correction is possible, and if possible error locations and error values for the received codeword.

11. An error correcting device comprising:

a codeword storage unit;

a syndrome generating unit coupled to the codeword storage unit, wherein the syndrome generating unit generates syndromes $S_0$ to $S_5$ from a received codeword stored in the codeword storage unit;

operation unit that calculates coefficients σ1, σ2, and σ3 of an error-location polynomial as $$\sigma_1 = \frac{S_4}{S_3}$$

$$\sigma_2 = \frac{S_5 + \sigma_1 S_4}{S_3}$$

$$\sigma_3 = \frac{S_3}{S_0}$$

in response to a first control signal, calculates the coefficients σ1, σ2, and σ3 of the error-location polynomial as $$\sigma_1 = \frac{S_5 + \sigma_2 S_3}{S_4}$$

$$\sigma_2 = \frac{S_3}{S_1}$$

$$\sigma_3 = \frac{S_4}{S_1} + \sigma_2 \sigma_1$$

in response to a second control signal, calculates the coefficients σ1, σ2, and σ3 of the error-location polynomial as $$\sigma_1 = \frac{S_3}{S_2}$$

$$\sigma_2 = \frac{S_4 + \sigma_1 S_3}{S_2}$$

$$\sigma_3 = \frac{S_5 + \sigma_1 S_4 + \sigma_2 S_3}{S_2}$$

in response to a third control signal, calculates the first and second syndrome equations A and B as $$A=S_2+\sigma \cdot S_1$$

$$B=S_3+\sigma \cdot S_2$$

(where σ is $S_1/S_0$) in response to a fourth control signal, calculates coefficients σ1' and σ2' of the error-location polynomial, and D as $$\sigma1'=(S_1 \cdot S_2+S_0 \cdot S_3)/\Delta$$

$$\sigma2'=(S_1 \cdot S_3+S_2{}^2)/\Delta$$

$$D = S_4 + \sigma1 \cdot S_3 + \sigma2 \cdot S_2$$

(where $\Delta = S_1^2 + S_0 \cdot S_2 \neq 0$) in response to a fifth control signal, calculates error locations and values from σ1' and σ2' in response to a sixth control signal, calculates coefficients Σ1, Σ2, and Σ3 of an error-location polynomial as $$\Sigma1 = (S_3 \cdot \sigma2' + S_4 \cdot \sigma1' + S_5)/D$$

$$\Sigma2 = (S_1 \cdot S_3 + S_0 \cdot S_4)/\Delta + \Sigma1 \cdot \sigma1'$$

$$\Sigma3 = (S_1 \cdot S_4 + S_2 \cdot S_3)/\Delta + \Sigma1 \cdot \sigma2'$$

in response to a seventh control signal, and calculates error locations and values from the coefficients Σ1, Σ2, and Σ3; and operation controller coupled to the operation unit, wherein the operation controller generates the first control signal if both of the syndromes $S_1$ and $S_2$ are zeros and the syndrome $S_0$ is not zero, the second control signal if both of the syndromes $S_0$ and $S_2$ are zeros and the syndrome $S_1$ is not zero, the third control signal if both of the syndromes $S_0$ and $S_1$ are zeros and the syndrome $S_2$ is not zero, the fourth control signal if two of the syndromes $S_0$, $S_1$, and $S_2$ are not zeros and if the syndrome $S_0$ is not zero or the syndrome $S_1$ is zero, the fifth control signal if both the syndrome equations A and B are not zero, the sixth control signal if the value D is zero, and a seventh control signal if the value D is not zero.

12. The error correcting device of claim 11, further comprising:

a determination controller for determining that no error is generated if all of the syndromes $S_0$ to $S_5$ are zeros, that error correction is impossible if all of the syndromes $S_0$, $S_1$, and $S_2$ are zeros and not all of the syndromes $S_3$, $S_4$, and $S_5$ are zeros, that three errors are generated if the error locations obtained from the coefficients σ1, σ2, and σ3 are in a codeword, that error correction is impossible if they are not all in the codeword, that an error is generated if both of the syndrome equations A and B are zeros, that two errors are generated if the value D is zero, and that three errors are generated if the value D is not zero; and means for performing single-error correction, double-error correction, or triple-error correction according to the determination result of the determination controlling means.

* * * * *